United States Patent [19]
Kondo et al.

[11] Patent Number: 4,963,187
[45] Date of Patent: Oct. 16, 1990

[54] METALLIZING PASTE FOR CIRCUIT BOARD HAVING LOW THERMAL EXPANSION COEFFICIENT

[75] Inventors: Kazuo Kondo, Nagoya; Asao Morikawa, Komaki, both of Japan

[73] Assignee: NGK Spark Plug Co., Ltd., Aichi, Japan

[21] Appl. No.: 164,361

[22] Filed: Mar. 4, 1988

[30] Foreign Application Priority Data

Mar. 4, 1987 [JP] Japan ............................. 62-47439
Mar. 4, 1987 [JP] Japan ............................. 62-47440

[51] Int. Cl.$^5$ ............................................ B22F 7/00
[52] U.S. Cl. ............................ 106/1.14; 106/1.13; 106/1.15; 106/1.26; 106/1.28; 252/514; 252/518; 252/520; 252/521; 75/252
[58] Field of Search ............ 75/252; 428/427, 407; 174/68.5; 252/518, 520, 521; 106/1.14, 1.13, 1.15, 1.26, 1.28

[56] References Cited

U.S. PATENT DOCUMENTS

| | | | |
|---|---|---|---|
| 4,301,324 | 11/1981 | Kumar et al. | 174/68.5 |
| 4,513,062 | 4/1985 | Suzuki et al. | 428/565 |
| 4,529,835 | 7/1985 | Mizuno | 174/68.5 |
| 4,559,277 | 12/1985 | Ito | 428/627 |

Primary Examiner—Stephen J. Lechert, Jr.
Assistant Examiner—Nina Bhat
Attorney, Agent, or Firm—Wegner & Bretschneider

[57] ABSTRACT

Metallizing paste is composed, by weight, of 100 parts of Pt, 0.5 to 5 parts of Ag, 0.1 to 1 part of CuO, and 2 to 10 parts of a low thermal expansion fritt, which may also contain up to 100 parts of Au. Another metallizing paste is composed, by weight, of 100 parts of Pd, 0.5 to 4 parts of Ag, 0.1 to 1 part of CuO, and 1 to 10 parts of a low thermal expansion fritt, which may also contain up to 50 parts of Au. A low thermal expansion circuit board with multi-layers is made up to a low thermal expansion substrate such as crystallized glass, AlN, SiC, $Si_3N_4$ etc. and metallized layers formed on the surface of the substrate based on the abovementioned metallizing pastes comprising crystallized glass type materials.

33 Claims, 1 Drawing Sheet

METALLIZING PASTE FOR CIRCUIT BOARD HAVING LOW THERMAL EXPANSION COEFFICIENT

BACKGROUND

This invention relates to metallizing paste for use in multi-layered circuit board for mounting integrated circuits (IC), IC-packages, and so forth thereon. More particularly, it is concerned with metallizing paste adaptable to ceramic substrate materials having a thermal expansion coefficient ($\alpha$) of $5.0 \times 10^{-6}/°$ C. or lower, such as crystallized glass, alumina-glass composite body, SiC, $Si_3N_4$, AlN, and so forth.

In recent years, with development in miniaturization, etc. of various electronic apparatuses and appliances, packaging (or mounting) density of those electrical components such as IC, etc. on the circuit board has become higher and higher. Considering, further, mounting of the power semiconductors, etc., quantity of heat generation on the circuit board becomes much greater.

On account of this, the substrate material to be used is also of ceramic having the thermal expansion coefficient ($\alpha$) of $5.0 \times 10^{-6}/°$ C. or lower (at a temperature ranging from room temperature to 400° C.), examples of which are SiC, $Si_3N_4$, AlN, and so forth. In recent years, there has also been developed the substrate made of crystallized glass material.

For such multi-layered substrates and packages of low thermal expansion coefficient, gold-metallization is usually used, onto which metallized layer metal members (such as leads) are joined by use of brazes such as AuSn or AuSi, or solders such as In/Pb and so on.

In the methods of joining the metal members to the substrates utilizing the brazing or soldering (generally referred to as "brazing" hereinafter) materials as mentioned above, there have been problems in its workability and reliability owing to softening of the brazing material by its reheating during joining of IC chips (at the time of die-mounting). It becomes therefore necessary that the metal member be joined by use of a high temperature brazing material (e.g., pure silver brazing). In this case, the paste for the substrate should also be compatible with this brazing material.

However, the gold metallizing pastes which have conventionally been used for the substrates and so on causes an alloy to be formed between the gold and the softened brazing material, when use is made of a high temperature brazing material such as pure silver braze. On account of this, the gold which has been metallized on the surface of ceramic material is dispersed in the brazing material to lower the bonding strength thereof to become unable to maintain it in a preferred amount and to bring about a problem presenting "eroding phenomenon by the brazing material".

Furthermore, as a method for metallizing ceramics, there has been known the so-called "Telefunken Process" utilizing high melting point metals. However, since these metals are, conductors of a high resistance, they are not suitable for metallizing the multi-layered circuit boards, and others.

SUMMARY OF THE DISCLOSURE

It is therefore a primary object of the present invention to provide a metallizing paste suitable for metallizing substrate materials for IC multi-layered circuit boards and IC-packages, in particular, substrate materials having a low thermal expansion coefficient, and also to provide circuit boards of a low thermal expansion coefficient, in which such metallizing paste is utilized.

Particularly, it is an object of the present invention to provide the metallizing paste suitable for the case where a metallized substrate is bonded with a lead wire through a high temperature brazing material, with use of a crystallized glass type material as the substrate material having a low thermal expansion coefficient, and also to provide circuit boards having a low thermal expansion coefficient using such metallizing paste.

It is a further object of the present invention to provide a highly durable metallizing paste which does not bring about the erosion phenomenon by the brazing material even when the high temperature brazing material is used, and is also difficult to migrate into the substrate material, hence capable of maintaining sufficient bonding strength, and also to provide circuit boards having a low thermal expansion coefficient.

It is a fourth object of the present invention to provide a metallizing paste which functions as a low resistance conductor, and which is less liable to signal transmission loss, and also to provide the circuit boards having a low thermal expansion coefficient using such metallizing paste.

It is a still further object of the present invention to provide a metallizing paste which is sufficiently adapted to those newest IC-devices having increased packaging density, by making those substrate materials of a low thermal expansion coefficient widely applicable as the multi-layered IC circuit boards.

According to the present invention in its first aspect, there is provided a metallizing paste comprising 100 parts by weight of Pt, 0.5 to 5 parts by weight of Ag, 0.1 to 1 part by weight of CuO, and 2 to 10 parts by weight of a low thermal expansion fritt.

According to the present invention in its second aspect, there is provided a metallizing paste of the same composition as mentioned in the above first aspect, to which 100 parts by weight or below (preferably 0.1 part by weight or above) of Au is further added as a sintering aid.

According to the present invention in its third aspect, there is provided a metallizing paste comprising 100 parts by weight of Pd, 0.5 to 4 parts by weight of Ag, 0.1 to 1 part by weight of CuO, and 1 to 10 parts by weight of a low thermal expansion fritt.

According to the present invention in its fourth aspect, there is provided a metallizing paste of the same composition as mentioned in the above third aspect, to which 50 parts by weight or below (preferably 0.1 part by weight or above) of Au is further added as a sintering aid.

The foregoing objects, other objects as well as specific compositions and functions resulting from such compositions according to the present invention will become more apparent and understandable from the following detailed description thereof, when read in conjunction with the accompanying drawing.

BRIEF DESCRIPTION OF THE DRAWING

In the drawing, the single

DETAILED DESCRIPTION OF PREFERRED EMBODIMENTS

Figure 1:
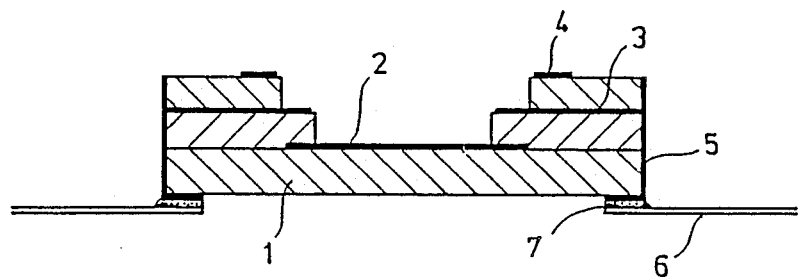
FIG. 1 is a cross-sectional view showing one embodiment of structure of a package, in which lead metals are brazed with silver braze to metallized layers formed by use of a metallizing paste according to the present invention.

As illustrated in FIG. 1, the package is constructed in such a manner that a substrate 1 comprises multi-layers formed on its both sides, the multi-layers consisting of a metallized die-bond layer (Au, Cu, Pd, Pt) 2 formed on the upper center part thereof, a metallized bonding pad layer (Au, Cu) 3 on the layers placed on both left and right sides of the substrate 1, a metallized seal ring (Au, Cu, Pd, or Pt) 4, and metallized leads (based on the paste according to the present invention) 5 formed on the entire side surfaces and end portions of the bottom surface of the substrate 1, to which a lead metal (Kovar, 42-Alloy or Cu-Alloy) 6 are connected to the rear surface of the substrate 1 with use of pure silver braze 7.

Table 1 below indicates the quantity of each component used in the abovementioned first and second aspects of the present invention (preferred ranges of the particle size of the material powders being also shown).

TABLE 1

| | Pt | Au | Fritt** | Ag | CuO | Organic Binder |
|---|---|---|---|---|---|---|
| Composition (parts)* | 100 | 0–100 | 2–10 | 0.5–5 | 0.1–1 | 1–5 |
| Particle size ($\mu$m) | 0.2–3.5 | 0.2–3 | 2–3 | 2–10 | 2–4 | xxx |

(NOTE: The composition denotes "parts by weight" with respect to 100 parts of platinum.)
**Crystallized glass (4% ZnO, 13% MgO, 23% $Al_2O_3$, 58% $SiO_2$, 1% $B_2O_3$ and 1% $P_2O_5$) as disclosed in USP 4,540,671 Kondo et al, at Sample No. 5 of Table 1.

With use of platinum as the principal ingredient, the bonding strength can be maintained at the high level. A preferred embodiment of present invention provides a metallizing paste, in which platinum (Pt) is used as the principal ingredient. Gold (Au) optionally used in this metallizing paste has a function of improving sinterability of the metallizing components as well as wetting property of silver (Ag). A quantity of Au exceeding 100 parts by weight is not preferred, because of increase in the deterioration of the brazing material. (Au migrates and dissipates out of the metallized layer by reacting with Ag. The dissipation of Au from the braze causes pin holes resulting in poor bonding strength.) A preferred range of Au is therefore from 10 to 50 parts by weight. It should be noted here that in the first aspect of the present invention, Au is not the essential ingredient.

The fritt is required for improving the adhesive property between the metallizing paste and the ceramic substrate material (or package). With this fritt being below 2 parts by weight, the bonding strength decreases. On the other hand, when it exceeds 10 parts by weight, the glass material becomes floating out on the metallized surface to prevent the pure silver braze from being wet. A preferred range of this fritt ranges from 3 to 8 parts by weight. This fritt is of a low thermal expansion material, which, in conjunction with the low thermal expansion substrate material, is able to provide a metallized substrate which has a low thermal expansion coefficient as a whole. As the low thermal expansion fritt, there may be exemplified crystallized glass type materials or composite materials of crystallized glass materials and ceramic materials. The crystallized glass contemplated in the present invention includes those which have a coefficient of thermal expansion $\alpha = 5$ to $45 \times 10^{-7}/°$ C. (from room temperature to 400° C.), or preferably 15 to $45 \times 10^{-7}/°$ C., most preferably 25 to $45 \times 10^{-7}/°$ C., and can be made solid (consolidated or sintered) by heating at about 1,100° C. or less (preferably 900°–1,000° C.). Generally such crystallized glasses are grouped to $RO—Al_2O_3—SiO_2$ systems where RO represents ZnO, MgO, $Li_2O$, $Y_2O_3$, $ZrO_2$, CaO, BaO, $B_2O_3$, $P_2O_5$, etc. Such glasses are, for instance, of the systems $ZnO—MgO—Al_2O_3—SiO_2$, $CaO—B_2O_3—MgO—Al_2O_3—SiO_2$, $Y_2O_3—MgO—Al_2O_3—SiO_2$, $Li_2O—Al_2O_3—SiO_2$, $BaO—Al_2O_3—SiO_2$, etc.

Particularly desirable crystallized glasses are as follows: (1) the one as disclosed in Japanese Patent Kokai Publication No. 59-92943, which is comprised, as the principal components, of 57 to 63% by weight of $SiO_2$, 20 to 28% by weight of $Al_2O_3$, 10 to 18% by weight of MgO, and 2 to 6% by weight of ZnO, to which 0.1 to 6% by weight of $B_2O_3$ and/or $P_2O_5$ is added, the resultant mixture of the crystallized glass components being pulverized, fritted, and shaped, after which it is re-crystallized; (2) the one as disclosed in Japanese Patent Kokai Publication No. 59-83957, which is comprised of 40 to 52% by weight of $SiO_2$, 27 to 37% by weight of $Al_2O_3$, 10 to 20% by weight of MgO, 2 to 8% by weight of $b_2O_3$, 2 to 8% by weight of CaO, and 0.1 to 3% by weight of $ZrO_2$, the resultant mixture of the crystallized glass components being pulverized, fritted, and shaped, after which it is re-crystallized; (3) the one as disclosed in Japanese Patent Kokai Publication No. 59-137341, which is comprised, as the principal components, of 55 to 63% by weight of $SiO_2$, 20 to 28% by weight of $Al_2O_3$, 1 to 8% by weight of $Y_2O_3$, and 10 to 20% by weight of MgO, to which 0.1 to 5% by weight of $B_2O_3$ and/or $P_2O_5$ is added, the resultant mixture of the crystallized glass components being pulverized, fritted, and shaped, after which it is fired again to be crystallized; (4) the one as disclosed in Japanese Patent Kokai Publication No. 59-64545, which is a glass/ceramic composite material obtained by dispersing 5 to 60 % (preferably 10 to 50%) by volume of ceramic particles (such as $Al_2O_3$, BN, $Si_3N_4$ or a mixture thereof having a particle size of a few microns or less), coated with $SiO_2$ thin film (e.g., a few tens to a few hundreds angstroms), in the crystallized glass having a thermal expansion coefficient of 5 to $45 \times 10^{-7}$. Either of these crystallized glass type materials has its percentage of water absorption of substantially zero, a thermal expansion coefficient (from room temperature to 400° C.) of from 15 to $35 \times 10^{-7}$, and a dielectric constant of 5.5 or so (at 1 MHz). Therefore either of these insulating layers formed substantially of such crystallized glasses, when used for the purpose of the present invention, indicates a thermal expansion coefficient which is very close to that of the heat-resistant substrate.

The crystallized glass of the $ZnO—MgO—Al_2O_3—SiO_2$ system such as disclosed in JP Kokai No. 59-92943 is advantageous in that it is converted to glass-ceramics having a major crystallite phase of cordierite ($2MgO—2Al_2O_3—5SiO_2$) precipitated through the heating for metallization (or consolidation) The cordierite-based glass-ceramics has a low dielectric constant, a low coefficient of thermal expansion, a high compatibility with silicon chips, a high resistance to thermal shock, and a low density or the like.

The paste is heated (fired) at 1,100° C. or less, preferably at a temperature of about 900° to about 1,000° C. for about 2 hours (more preferably, at about 950° to about 1,000° C. for about 1.5 hours) for metallization (consolidation) and crystallization.

Silver (Ag) is for completing sintering of the metallized layer. When its content is below 0.5 part by weight, incomplete sintering of the metallized layer is resulted; on the other hand, when its content exceeds 4 parts by weight, there is a tendency of migration of silver into the substrate material. A preferred range of silver is therefore from 1 to 5 parts by weight, or more preferably 4 parts by weight or less.

CuO is for increasing wetting property between the metal component and the glass component (and further the ceramic substrate material) to maintain the required bonding strength, and also to obtain an appropriate thermal shrinkage factor. When its content is below 0.1 part by weight, insufficient bonding is resulted; on the other hand, when its content exceeds 1 part by weight, excessive quantity of CuO migrates into the ceramic substrate material to bring about difference in the heat shrinkage factor between the diffused part and non-diffused part of CuO in the ceramic substrate material, which causes unfavorable warping based on the heating. A preferred range of CuO ranges from 0.3 to 0.7 part by weight.

The metallizing components are each blended in the form of powder, the particle size of which should preferably be in the ranges as shown in Table 2 below for the sake of promoting the sinterability and contributing to improvement in the bonding strength.

For the organic binder, there may be used those conventional organic substances, resins, and so forth such as, for example, cellulose, PVA, etc., the quantity of use of which should preferably range from 2 to 4 parts by weight. In the film coating operation, it is further preferable to blend a solvent such as, for example, alcohol, acetone, etc. to adjust the viscosity.

Table 2 below indicates the quantity of each component used in the abovementioned third and fourth aspects of the present invention (preferred ranges of the particle size of the material powders being also shown).

TABLE 2

|  | Pd | Au | Fritt | Ag | CuO | Organic Binder |
|---|---|---|---|---|---|---|
| Composition (part by weight) | 100 | 0–50 | 1–10 | 0.5–4 | 0.1–1 | 1–5 |
| Particle size of powder material (μm) | 2–10 | 0.2–3 | 2–3 | 2–10 | 2–4 | xxx |

With use of palladium (Pd) as the principal component, the bonding strength can be maintained at a high level. The element is also able to contribute to increase in the bonding strength as is the case with platinum (Pt).

The significance, function and so on of the other metallizing components are basically same as those in the first and second aspects of the present invention, provided that, from the standpoint of making these components adaptable to the platinum component, increasing the bonding strength, and also maintaining the low resistance, a range of content of Au is from 0 to 50 parts by weight, and that of fritt is from 1 to 10 parts by weight (a more preferred range being from 10 to 30 parts by weight for Au, and from 3 to 8 parts by weight for fritt).

As for the particle size, it is preferable to set its range as shown in Table 2 above from the standpoint of the sinterability and bonding property.

It is also feasible to use a mixture of Pt and Pd as the principal components. In this case, it is advisable to mix a specified quantity of each component corresponding to the composition for Pt or Pd, whichever larger in the quantity with respect to the total quantity of 100 parts by weight.

The metallizing paste according to the present invention is, as usual, printed on the substrate material (e.g., by screen-printing), then subjected to removal (pre-heating) of the organic binder, and is heated for metallization, thereby enabling the metallized substrate to be manufactured. In this case, by carrying out the heating at a relatively low temperature from 900° to 1,000° C., it is possible to effect the simultaneous heating for those crystallized glass type substrate materials, in particular, which have been heated at a low temperature. It has already been verified, in this case, that the heating can be done in a non-oxidizing atmosphere such as $N_2$-atmosphere, reducing gas atmosphere, and so forth, besides the ordinary oxidizing atmosphere, whereby the same degree of bonding strength as achieved by the heat treatment in the oxidizing atmosphere is obtained. When the heating is carried out in the non-oxidizing atmosphere, it is recommendable to effect calcination in the oxygen atmosphere at a temperature ranging from 600° C. to 800° C. between the step of removing resin and the step of heating for a complete removal of the organic binder.

The metallizing pastes according to the present invention (throughout all the aspects) are used preferably for metallizing the substrate having a low thermal expansion coefficient. For such low thermal expansion substrate materials, there may be exemplified crystallized glass materials, glass-ceramic composite materials (these both being referred to as "crystallized glass type materials"), SiC, $Si_3N_4$, AlN, and so on. In particular, those materials having the same quality as the fritt of low thermal expansion coefficient are preferred. The thickness of the metallized layer is so selected as to give sufficient conductivity in the resultant layer, e.g., generally about 5 to about 40 μm, preferably about 10 to about 20 μm in the metallized state. This layer thickness should be as thin as possible so long as the conductivity and production yield permit. These materials are suitable for metallization of single-layered or multi-layered IC substrates; in particular, metallization of the substrate materials when the substrate is to be joined with lead wires through a brazing material. Above all, they are suitable for use with high temperature brazing material such as, for example, silver brazing.

With a view of enabling those persons skilled in the art to put the present invention into practice, the following preferred examples are presented. It should however be noted that these examples are merely illustrative of the invention and not so restrictive, and that various changes and modifications in the ingredients used and the metallizing conditions may be made by those skilled in the art within the spirit and scope of the invention as disclosed herein and recited in the appended claims.

EXAMPLE 1

(Preparation of Paste)

Powder of each inorganic material was weighed for its prescribed quantity, and then the weighed materials were placed in an agate mortar, in which they were pulverized with an agate pestle (e.g. for about one hour) so as to be sufficiently mixed to obtain uniformly dispersed powder materials. Into this dispersed powder mixture, there was poured an organic binder (ethyl cellulose) which had previously been dissolved in a solvent (a mixed solvent of butylcarbitol and acetone), and, while sufficiently stirring the batch with the pestle, the solvent was caused to volatilize from the mixture and simultaneously the resin and the inorganic powders were sufficiently kneaded to dryness (e.g. for about one hour). (Production of Test Samples)

Fritt of crystallized glass (a same glass as Sample No. 5, Table 1 of U.S. Pat. No. 4,540,671) was made into a sheet by the doctor blade method. Then, on this sheet, platinum type paste as shown in Table 3 below was applied by screen-printing, then the sheet and the printed paste thereon were heated to remove by oxidizing the resin contained in the paste, followed by further heating at a temperature in a range of from 900° C. to 1,000° C., and then lead metals were brazed to the sheet by use of a pure silver braze. The thus obtained combination was measured for its bonding strength

*The crystallized glass (fritt) was prepared as follows.

A mixture of $ZnO$, $MgCO_3$, $Al(OH)_3$, $SiO_2$, $H_3BO_3$ and $H_3PO_4$ was weighed and mixed so as to make up an oxide composition, by weight %, of 4% $ZnO$, 13% $MgO$, 23% $Al_2O_3$, 58% $SiO_2$, 1% $B_2O_3$ and 1% $P_2O_5$ (total 100%). The mixture was melted at 1,450° C. in an alumina crusible followed by quenching in water to form a particulated glass which was further pulverized into a fritt of an average particle size of 2 $\mu m$.

TABLE 3

| Sample Paste No. | Composition (wt. part) | | | | | Bonding Strength* (kg/□) | Resistance (mΩ/□) |
|---|---|---|---|---|---|---|---|
| | Pt | Au | Fritt | Ag | CuO | Resin | | |
| 1 | 100 | 20 | 7 | 1 | 0.5 | 3 | 2.1, 2.4 | 55 |
| 2 | 100 | 20 | 7 | 3 | 0.5 | 3 | 2.6, 1.9 | 50 |
| 3 | 100 | 20 | 7 | 5 | 0.5 | 3 | 2.6, 2.2 | 48 |
| 4 | 100 | 40 | 7 | 3 | 0.5 | 3 | 2.1, 1.8 | 45 |
| 5 | 100 | 100 | 7 | 3 | 0.5 | 3 | 2.0, 1.9 | 35 |

(NOTE: *The bonding strength denotes a value with a sheet of 1.6 × 1.6 mm in size)

EXAMPLE 2

The preparation of paste and the production of test samples were carried out in the same manner as in Example 1 above with the exception that palladium (Pd) type paste component as shown in Table 4 below was used as the paste component. The test results are also indicated in the Table.

TABLE 4

| Sample Paste No. | Composition (wt. part) | | | | | Bonding Strength (kg/□) | Resistance (mΩ/□) |
|---|---|---|---|---|---|---|---|
| | Pd | Au | Fritt | Ag | CuO | Resin | | |
| 6 | 100 | 20 | 7 | 1 | 0.5 | 3 | 1.5, 1.2 | 60 |
| 7 | 100 | 0 | 7 | 3 | 0.5 | 3 | 2.1, 2.1 | 65 |

What is claimed is:

1. Metallizing paste consisting essentially of 100 parts of Pt, 0.5 to 5 parts of Ag, 0.1 to 1 part of CuO, and 2 to 10 parts of a low thermal expansion frit, all being by weight.

2. Metallizing paste as set forth in claim 1, wherein Ag ranges from 1 to 5 parts, CuO ranges from 0.3 to 0.7 part, and the low thermal expansion frit ranges from 3 to 8 parts, all by weight.

3. Metallizing paste for low thermal expansion substrates consisting essentially of 100 parts of Pt, 100 parts or below of Au, 0.5 to 5 parts of Ag, 0.1 to 1 part of CuO, and 2 to 10 parts of a low thermal expansion frit, all being by weight.

4. Metallizing paste as set forth in claim 3, wherein Au ranges from 10 to 50 parts, Ag ranges from 1 to 5 parts, CuO ranges from 0.3 to 0.7 part, and the low thermal expansion frit ranges from 3 to 8 parts, all by weight.

5. Metallizing paste consisting essentially of 100 parts of Pd, 0.5 to 4 parts of Ag, 0.1 to 1 part of CuO, and 1 to 10 parts of a low thermal expansion frit all being by weight.

6. Metallizing paste as set forth in claim 5, wherein Ag ranges from 1 to 3 parts, CuO ranges from 0.3 to 0.7 part, and the low thermal expansion frit ranges from 3 to 8 parts, all by weight.

7. Metallizing paste consisting essentially of 100 parts of Pd, 50 parts or below of Au, 0.5 to 4 parts of Ag, 0.1 to 1 part of CuO, and 1 to 10 parts of a low thermal expansion frit, all being by weight.

8. Metallizing paste as set forth in claim 7, wherein Au ranges from 10 to 30 parts, Ag ranges from 1 to 3 parts, CuO ranges from 0.3 to 0.7 part, and the low thermal expansion frit ranges from 3 to 8 parts, all by weight 9. Metallizing paste as set forth in claim 1 or 3, wherein the particle size of each powder material for the paste components ranges from 0.2 to 3.5 $\mu m$ for Pt, from 0.2 to 3 $\mu m$ for Au, from 2 to 10 $\mu m$ for Ag, from 2 to 4 $\mu m$ for CuO, and from 2 to 3 $\mu m$ for the frit.

10. Metallizing paste as set forth in claim 5 or 7, wherein the particle size of each powder material for the paste components ranges from 0.2 to 10 $\mu m$ for Pd, 0.2 to 3 $\mu m$ for Au, 2 to 10 $\mu m$ for Ag, from 2 to 4 $\mu m$ for CuO, and from 2 to 3 $\mu m$ for the frit.

11. Metallizing paste as set forth in any one of claims 1, 3, 5 and 7, wherein said low thermal expansion frit is a crystallized glass material or a composite material of a crystallized glass material and a ceramic material (both being referred to as "crystallized glass type material").

12. Metallizing paste as set forth in claim 11, wherein the thermal expansion coefficient of said crystallized glass type material is 5 to $45 \times 10^{-7}/°$ C. within a temperature range from room temperature to 400° C.

13. Metallizing paste as set forth in claim 12, wherein the thermal expansion coefficient of said crystallized glass type material is 15 to $45 \times 10^{-7}/°$ C. within a temperature range from room temperature to 400° C.

14. Metallizing paste as set forth in claim 13, wherein the thermal expansion coefficient of said crystallized glass type materials is 25 to $45 \times 10^{-7}/°$ C. within a temperature range from room temperature to 400° C.

15. Metallizing paste as set forth in claim 13, wherein the thermal expansion coefficient of said crystallized glass type materials is 15 to $35 \times 10^{-7}/°$ C. within a temperature range from room temperature to 400° C.

16. Metallizing paste as set forth in any one of claims 1, 3, 5 and 7 wherein said crystallized glass is selected from the group generally expressed by a formula $RO-Al_2O_3-SiO_2$ where RO represents ZnO, MgO, $Li_2O$, $Y_2O_3$, $ZrO_2$, CaO, BaO, $B_2O_3$ or $P_2O_5$.

17. Metallizing paste as set forth in claim 16, wherein said crystallized glass in selected from the group consisting of $ZnO-MgO-Al_2O_3-SiO_2$, $CaO-B_2O_3-MgO-Al_2O_3-SiO_2$, $Y_2O_3-MgO-Al_2O_3-SiO_2$, $Li_2O-Al_2O_3-SiO_2$ and $BaO-Al_2O_3-SiO_2$.

18. Metallizing paste as set forth in claim 16, wherein said crystallized glass is composed of, by weight, 57-63% $SiO_2$, 20-28% $Al_2O_3$, 10-18% MgO, 2-6% ZnO and 0.1-6% of at least one of $B_2O_3$ and $P_2O_5$.

19. Metallizing paste as set forth in claim 16, wherein said crystallized glass is composed of, by weight, 40-52% $SiO_2$, 27-37% $Al_2O_3$, 10-20% MgO, 2-8% $B_2O_3$, 2-8% CaO, and 0.1-3% $ZrO_2$.

20. Metallizing paste as set forth in claim 16, wherein said crystallized glass is composed of, by weight, 55-63% $SiO_2$, 20-28% $Al_2O_3$, 1-8% $Y_2O_3$, 10-20% MgO and 0.1-5% of at least one of $B_2O_3$ and $P_2O_5$.

21. Metallizing paste as set forth in claim 16, wherein said crystallized glass is of a $ZnO-MgO-Al_2O_3-SiO_2$ system and, when crystallized, has a major crystallite phase of cordierite.

22. Metallizing paste as set forth in claim 16, wherein said crystallized glass contains up to 60% by volume of fine ceramic particles coated with a thin $SiO_2$ film.

23. Metallizing paste as set forth in claim 22, wherein said ceramic particles are selected from the group consisting of $Al_2O_3$, BN and $Si_3N_4$.

24. Metallizing paste as set forth in claim 1, wherein Pd is further present in an amount such that the sum of Pt and Pd makes 100 parts by weight.

25. Metallizing paste as set forth in claim 1 or 3, wherein Ag is no more than 4 parts by weight.

26. A low thermal expansion circuit board comprising a low thermal expansion substrate and at least one metallized layer formed on the surface of said substrate based on the metallizing paste defined by any one of claims 1, 3, 5 and 7.

27. The circuit board as set forth in claim 26, wherein said metallized layer has a thickness of about 5 to about 40 μm.

28. The circuit board as set forth in claim 27, wherein said metallized layer has a thickness of about 10 to about 20 μm.

29. The low thermal expansion circuit board as set forth in claim 26, wherein said low thermal expansion substrate is made of one selected from the group consisting of crystallized glass materials, SiC, $Si_3N_4$, AlN and composite materials of crystallized glass and ceramics.

30. The low thermal expansion circuit board as set forth in claim 29, wherein said low thermal expansion substrate is made of the same material as the low thermal expansion frit of the metallizing paste.

31. The low thermal expansion circuit board as set forth in claim 26, wherein said metallized layer is bonded with lead wires through a brazing material.

32. The low thermal expansion circuit board as set forth in claim 31, wherein said brazing material is a high temperature brazing material.

33. The low thermal expansion circuit board as set forth in claim 32, wherein said high temperature brazing material is a pure silver braze.

* * * * *